United States Patent
Moffatt et al.

(10) Patent No.: US 8,247,317 B2
(45) Date of Patent: Aug. 21, 2012

(54) METHODS OF SOLID PHASE RECRYSTALLIZATION OF THIN FILM USING PULSE TRAIN ANNEALING METHOD

(75) Inventors: Stephen Moffatt, St. Lawrence (JE); Aaron Muir Hunter, Santa Cruz, CA (US); Bruce E. Adams, Portland, OR (US)

(73) Assignee: Applied Materials, Inc., Santa Clara, CA (US)

(*) Notice: Subject to any disclaimer, the term of this patent is extended or adjusted under 35 U.S.C. 154(b) by 92 days.

(21) Appl. No.: 12/764,723

(22) Filed: Apr. 21, 2010

(65) Prior Publication Data

US 2011/0065264 A1 Mar. 17, 2011

Related U.S. Application Data

(60) Provisional application No. 61/243,118, filed on Sep. 16, 2009.

(51) Int. Cl.
*H01L 21/20* (2006.01)
(52) U.S. Cl. .................. 438/487; 257/E21.133
(58) Field of Classification Search .......... 438/487, 438/488, 482
See application file for complete search history.

(56) References Cited

U.S. PATENT DOCUMENTS

| | | | |
|---|---|---|---|
| 6,451,631 B1 | 9/2002 | Grigoropoulos et al. | |
| 6,602,765 B2 * | 8/2003 | Jiroku et al. | 438/487 |
| 7,358,165 B2 * | 4/2008 | Shoji et al. | 438/487 |
| 7,459,353 B2 | 12/2008 | Son et al. | |
| 7,547,914 B2 | 6/2009 | Kermarec et al. | |
| 2005/0019996 A1 | 1/2005 | Tsao | |
| 2007/0166963 A1 | 7/2007 | Son et al. | |
| 2009/0120924 A1 | 5/2009 | Moffatt et al. | |

OTHER PUBLICATIONS

Felch article, "Sub-Melt Laser Annealing Followed by Low-Temperature RTP for Minimized Diffusion." IEEE 2000, pp. 167-170.
International Search Report and Written Opinion of the International Searching Authority mailed Nov. 30, 2010 in PCT/US2010/035013 (APPM/014405PCT).

* cited by examiner

*Primary Examiner* — Charles Garber
*Assistant Examiner* — Reema Patel
(74) *Attorney, Agent, or Firm* — Patterson & Sheridan, LLP (57) ABSTRACT

Embodiments of the present invention provide methods of solid phase recrystallization of thin film using a plurality of pulses of electromagnetic energy. In one embodiment, the methods of the present invention may be used to anneal an entire substrate surface or selected regions of a surface of a substrate by delivering a plurality of pluses of energy to a crystalline seed region or layer upon which an amorphous layer is deposited to recrystallize the amorphous layer so that it has the same grain structure and crystal orientation as that of the underlying crystalline seed region or layer.

8 Claims, 8 Drawing Sheets

312 — DELIVER MULTIPLE PULSE OF ELECTROMAGNETIC RADIATION TO THE CRYSTALLINE SEED LAYER TO RECRYSTALLIZE AMORPHOUS LAYER

314 — RECRYSTALLIZAION OF AMORPHOUS LAYER USING CRYSTALLINE SEED LAYER AS A SEED

METHODS OF SOLID PHASE RECRYSTALLIZATION OF THIN FILM USING PULSE TRAIN ANNEALING METHOD

CROSS-REFERENCE TO RELATED APPLICATIONS

This application claims benefit of U.S. Provisional Patent Application Ser. No. 61/243,118, filed Sep. 16, 2009, which is incorporated by reference in its entirety herein.

BACKGROUND OF THE INVENTION

1. Field of the Invention

Embodiments of the present invention generally relate to a method of manufacturing a semiconductor device. More particularly, the invention is directed to a method of thermally processing a substrate.

2. Description of the Related Art

The integrated circuit (IC) market is continually demanding greater memory capacity, faster switching speeds, and smaller feature sizes. One of the major steps the industry has taken to address these demands is to change from batch processing silicon wafers in large furnaces to single wafer processing in a small chamber. During such single wafer processing the wafer is typically heated to high temperatures so that various chemical and physical reactions can take place in multiple IC devices defined in the wafer.

Integrated circuit can be fabricated relative to one or both of bulk semiconductor substrates, such as silicon wafers, and silicon-on-insulator (SOI) substrates. One method of forming SOI substrate includes epitaxially growing single crystalline silicon on insulator. Epitaxial silicon single crystal wafers have long been widely used as wafers for the manufacture of discrete semiconductors, bipolar ICs and so forth because of their excellent characteristics. Epitaxial silicon single crystal wafers are also widely used for microprocessor units or flash memory devices because of their excellent soft error and latch up characteristics. Unfortunately, epitaxially grown silicon tends to form crystalline defects such as dislocations and stacking faults, which can result in undesired leakage within or between the resulting fabricated devices. In addition, epitaxial growth techniques have a very slow growth rate since it requires close lattice matching between the substrate and the overlayer, which therefore significantly reduces throughput and causes higher operating cost.

Therefore, there exists a need for improved methods that can be used to efficiently form a high quality single crystal layer over a substrate.

SUMMARY OF THE INVENTION

Embodiments of the invention may provide a method of solid phase recrystallization of thin film using electromagnetic energy in a series of sequential pulses of energy. More specifically, embodiments of the present invention provide a method of phase transformation of a layer deposited over a substrate, comprising depositing an insulation layer over the substrate, forming a seed region having a first material in a first phase structure in a desired area of the insulation layer, depositing a layer of first material having a second phase structure over the seed region and at least a portion of the insulation layer, and directing a plurality of pulses of electromagnetic energy toward a surface of the seed region upon which the layer of first material is deposited for a period of time that is sufficient to recrystallize and convert the layer of first material, using the seed region as a seed, from the second phase structure into the first phase structure and having the same grain structure and crystal orientation as the underlying seed region.

Embodiments of the present invention also provide a method of epitaxial growth of crystalline layers over a substrate, comprising depositing a first insulation layer over the substrate, forming a first seed region having a first material in crystalline state in the first insulation layer, depositing a first layer of first material in amorphous state over the first seed region and at least a portion of the first insulation layer, depositing a second insulation layer over the first layer of first material, forming a second seed region having a first material in crystalline state in the second insulation layer, depositing a second layer of first material in amorphous state over the second seed region and at least a portion of the second insulation layer, directing a plurality of pulses of first electromagnetic energy toward a surface of the first seed region upon which the first layer of first material is deposited for a period of time that is sufficient to recrystallize and convert the first layer of first material, using the first seed region as a seed, from amorphous state into crystalline state and having the same grain structure and crystal orientation as the underlying first seed region, and directing a second electromagnetic energy having a wavelength and number of pulses that are different from the first electromagnetic energy toward a surface of the second seed region upon which the second layer of first material is deposited for a period of time that is sufficient to recrystallize and convert the second layer of first material, using the second seed region as a seed, from amorphous state into crystalline state and having the same grain structure and crystal orientation as the underlying second seed region.

Embodiments of the present invention further provide a method of epitaxial growth of a single crystal silicon layer over a substrate, comprising depositing an insulation layer over a surface of the substrate, forming a via in a desired area of the insulation layer, wherein the via is filled with a single crystal silicon material, depositing an amorphous silicon layer over the via and at least a portion of the insulation layer, and directing a plurality of pulses of electromagnetic energy toward a surface of the via above which the amorphous silicon layer is located to epitaxial re-growth the amorphous silicon layer, using the single crystal silicon material within the via as a seed, so that the amorphous silicon layer is recrystallized to have the same grain structure and crystal orientation as the underlying single crystalline silicon material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally provides methods of solid phase recrystallization of thin film using a plurality of pulses of electromagnetic energy. In one embodiment, the methods of the present invention may be used to anneal an entire substrate surface or selected regions of a surface of a substrate by delivering a plurality of pluses of energy to a crystalline seed region or layer upon which an amorphous layer is deposited to recrystallize the amorphous layer so that it has the same grain structure and crystal orientation as that of the underlying crystalline seed region or layer. As will be discussed later, the annealing process generally includes delivering enough energy in a series of sequential pulses of energy to induce a controlled crystallization of amorphous layer, using underlying regions that is substantially pure ordered crystal as a seed, so that a single crystalline layer having a new arrangement of crystals or grains is progressively formed throughout the amorphous layer.

Figure 1A:
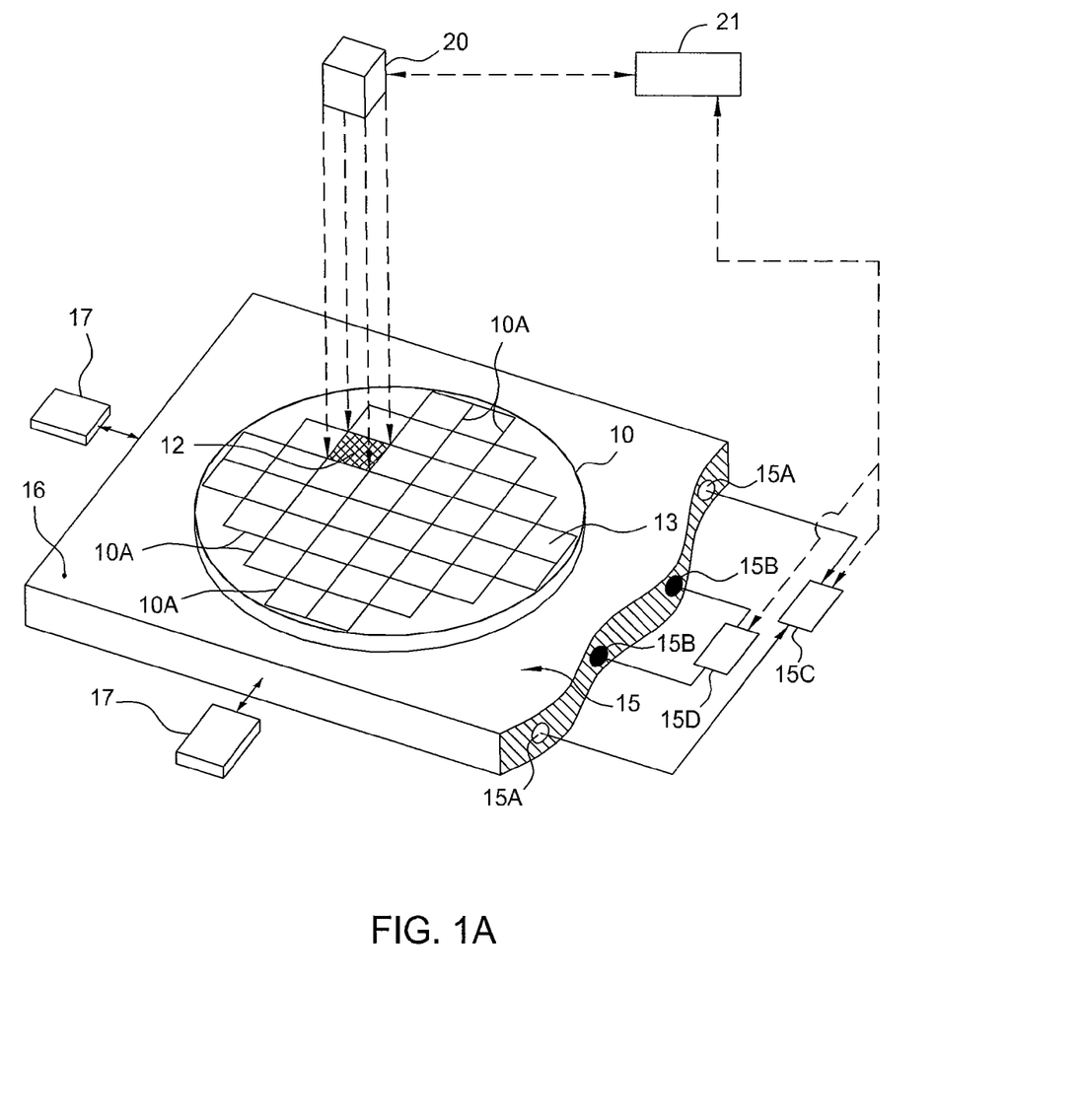
FIG. 1A illustrates a schematic isometric view of a laser anneal apparatus that is adapted to project an amount of energy on a defined region of the substrate described within an embodiment herein.

FIG. 1A illustrates an isometric view of one embodiment of the invention that may be used to practice the present invention. In one embodiment, an energy source 20 is adapted to project an amount of energy on a defined region, or an anneal region 12, of the substrate 10 to preferentially anneal certain desired regions within the anneal region 12. In one embodiment, as shown in FIG. 1A, only one or more defined regions of the substrate, such as anneal region 12, are exposed to the radiation from the energy source 20 at any given time. In one aspect of the invention, a single area of the substrate 10 is sequentially exposed to a desired amount of energy delivered from the energy source 20 to cause preferential annealing of desired regions of the substrate. In one example, one area on the surface of the substrate after another is exposed by moving the substrate relative to the output of the electromagnetic radiation source (e.g., conventional X-Y stage, precision stages) and/or translating the output of the radiation source relative to the substrate. Typically, one or more conventional electrical actuators 17 (e.g., linear motor, lead screw and servo motor), which may be part of a separate precision stage (not shown), are used to control the movement and position of substrate 10. Conventional precision stages that may be used to support and position the substrate 10, and heat exchanging device 15, may be purchased from Parker Hannifin Corporation, of Rohnert Park, Calif. In another embodiment, a complete surface of the substrate 10 is sequentially exposed all at one time (e.g., all of the anneal regions 12 are sequentially exposed).

In one aspect shown in FIG. 1A, the anneal region 12, and radiation delivered thereto, is sized to match the size of the die 13 (e.g., 40 "die" are shown in FIG. 1), or semiconductor devices (e.g., memory chip), that are formed on the surface of the substrate. In one aspect, the boundary of the anneal region 12 is aligned and sized to fit within the "kerf" or "scribe" lines 10A that define the boundary of each die 13. In one embodiment, prior to performing the annealing process, the substrate is aligned to the output of the energy source 20 using alignment marks typically found on the surface of the substrate and other conventional techniques so that the anneal region 12 can be adequately aligned to the die 13. Sequentially placing anneal regions 12 so that they only overlap in the naturally occurring unused space/boundaries between die 13, such as the scribe or kerf lines, reduces the need to overlap the energy in the areas where the devices are formed on the substrate and thus reduces the variation in the process results between the overlapping anneal regions. Therefore, the amount of process variation, due to the varying amounts of exposure to the energy delivered from the energy source 20 to process critical regions of the substrate is minimized, since any overlap of delivered energy between the sequentially placed anneal regions 12 can be minimized. In one example, each of the sequentially placed anneal regions 12 are a rectangular region that is about 22 mm by about 33 mm in size (e.g., area of 726 square millimeters ($mm^2$)). In one aspect, the area of each of the sequentially placed anneal regions 12 formed on the surface of the substrate is between about 4 $mm^2$ (e.g., 2 mm×2 mm) and about 1000 $mm^2$ (e.g., 25 mm×40 mm). It is contemplated that the size of the anneal region 12 is adjustable upon the need of processing schemes. As will be further discussed below, in one embodiment the size of the anneal region 12 may be adjusted to match the size of the crystalline seed region formed in an insulation layer or on the front surface of the insulation layer. In one example, the anneal region 12 is adjusted to process the seed region having a surface area between about 30 $nm^2$ and about 60 $nm^2$. In one example, the seed region may comprise numerous seed regions arranged across or at edge of the insulation layer.

It should be noted that the shape of the edges of the anneal regions 12 could be any shape without varying from the scope of the invention as described herein. In general, it is desirable to deliver a pulse of energy that has a uniform energy density per unit time (e.g., watts/$mm^2$-sec) across the anneal region 12 so that the annealing process on all parts of the anneal region 12 are uniform. For example, it desirable to deliver a pulse of energy that has a uniformity across the anneal region 12 that is less than about 5%, where uniformity is measured by dividing the standard deviation by the mean value.

The energy source 20 is generally adapted to deliver electromagnetic energy to preferentially anneal certain desired regions of the substrate surface. Typical sources of electromagnetic energy include, but are not limited to, an optical radiation source (e.g., laser or flash lamps), an electron beam source, an ion beam source, and/or a microwave energy source. In one aspect, the substrate 10 is exposed to multiple pulses of energy from a laser that emits radiation at one or more appropriate wavelengths for a desired period of time. In one aspect, the multiple pulses of energy from the energy source 20 are tailored so that the amount of energy delivered across the anneal region 12 and/or the amount of energy delivered over the period of the pulse is optimized so as not to melt, or nearly melt the regions or a specific layer (e.g., amorphous silicon layer in one embodiment of the present invention) that has been deposited on the substrate surface, but to deliver enough energy to promote epitaxial re-growth of the amorphous layer 410, progressively from the surface of the crystalline seed region. Therefore, a significant portion of the crystalline seed region underneath the annealed regions is activated and propagates throughout the amorphous layer, thereby recrystallizing the amorphous layer deposited thereabove. In this manner, each pulse completes a micro-anneal cycle resulting in epitaxial growth of a few lattice planes of ordered crystal near the bottom of the disordered anneal region. Meanwhile, the multiple pulses of energy from the energy source 20 may be controllably adjusted so that the amount of energy delivered across the anneal region 12 is able to remove a significant amount of damage within the amorphous layer from one lattice plane, or from a small group of lattice planes, at one time.

In one embodiment, the wavelength of the energy source 20 is tuned so that a significant portion of the radiation is absorbed by a layer disposed on the substrate 10. For an anneal process performed on a silicon containing layer, for example, the wavelength of the radiation may be less than about 800 nm, and can be delivered at deep ultraviolet (UV), infrared (IR) or other desirable wavelengths. In one embodiment, the energy source 20 is an intense light source, such as a laser, that is adapted to deliver radiation at a wavelength between about 500 nm and about 11 micrometers. In another embodiment, the energy source 20 may be a tungsten halogen lamp or a flash lamp featuring a plurality of radiation-emitting lamps, such as xenon, argon, or krypton discharge lamps. In such a case, a shutter may be used to manage pulses (will be discussed below). In all cases, the energy pulse used in the anneal process generally takes place over a relatively short time, such as on the order of about 1 nsec to about 10 msec.

Figure 1B:
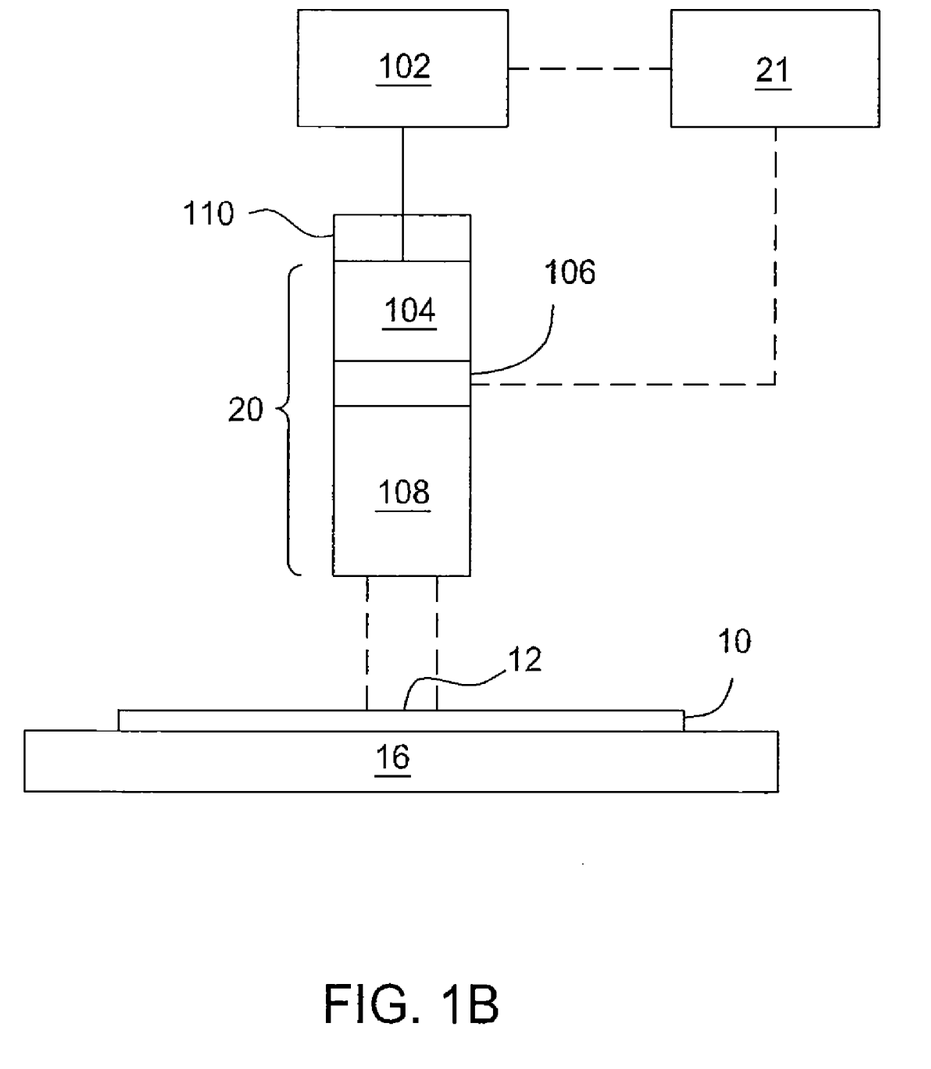
FIG. 1B illustrates a schematic view of the laser anneal apparatus illustrated in FIG. 1A according to an embodiment described herein.

FIG. 1B is a schematic side view of the apparatus of FIG. 1A. A power source 102 is coupled to the energy source 20. In one embodiment, the energy source 20 comprises an energy generator 104, which may be a light source such as those described above, and an optical assembly 108. The energy generator 104 is configured to produce energy and direct it into the optical assembly 108, which in turn shapes the energy as desired for delivery to the substrate 10. The optical assembly 108 generally comprises lenses, filters, mirrors, and the like that are configured to focus, polarize, de-polarize, filter or adjust coherency of the energy produced by the energy generator 104, with the objective of delivering a uniform column of energy to the anneal region 12. An example of the optical assembly 108 is further disclosed in detail in U.S. patent application Ser. No. 11/888,433 (entitled "APPARATUS AND METHOD OF IMPROVING BEAN SHAPING AND BEAM HOMOGENIZATION"), filed on Jul. 31, 2007, which is incorporated herein by reference in its entirety.

In order to deliver pulses of energy, the energy generator 104 may contain a pulsed laser, which is configurable to emit light at a single wavelength or at two wavelengths simultaneously. In one embodiment the energy generator 104 may comprise a Nd:YAG laser, with one or more internal frequency converters that cause a laser head to emit light at different laser frequency. Alternatively, the energy generator 104 may be configured to emit three or more wavelengths simultaneously, or further alternatively or additionally, to provide a wavelength-tunable output. In one example, the laser head used in the energy generator 104 is Q-switched to emit short, intense pulses, with pulse duration ranging, for example, from 1 nanosecond to 1 second.

In order to realize pulsed lasers, in one embodiment the apparatus may contain a switch 106. The switch 106 may be a fast shutter that can be opened or closed in 1 µsec or less. Alternately, the switch 106 may be an optical switch, such as an opaque crystal that becomes clear in less than 1 µsec when light of a threshold intensity impinges on it. In some embodiments, the optical switch may be configured to change state in less than 1 nsec. The optical switch generates pulses by interrupting a continuous beam of electromagnetic energy directed toward a substrate. The switch is operated by a controller 21, and may be located outside the energy generator 104, such as coupled to or fastened to an outlet area of the energy generator 104, or it may be located inside the energy generator 104. In an alternate embodiment, the energy generator may be switched by electrical means. The controller 21 may be configured to switch the power source 102 on and off as needed, or a capacitor 110 may be provided such that it is charged by the power source 102 and discharged into the energy generator 104 by virtue of circuitry energized by the controller 21. Electrical switching by capacitor is a way of self-switching, because the energy generator 104 stops generating energy when electricity provided by the capacitor 110 falls below a certain power threshold. When the capacitor 110 is recharged by the power source 102, it can then be discharged into the energy generator 104 to generate another pulse of energy. In some embodiments, the electrical switch may be configured to switch power on or off in less than 1 nsec.

In one embodiment, it may be desirable to control the temperature of the substrate during thermal processing by placing a surface of the substrate 10, as illustrated in FIG. 1A, in thermal contact with a substrate supporting surface 16 of a heat exchanging device 15. The heat exchanging device 15 is generally adapted to heat and/or cool the substrate prior to or during the annealing process. In this configuration, the heat exchanging device 15, such as a conventional substrate heater available from Applied Materials, Inc., Santa Clara, California, may be used to improve the post-processing properties of the annealed regions of the substrate. In general, the substrate 10 is placed within an enclosed processing environment (not shown) of a processing chamber (not shown) that contains the heat exchanging device 15. The processing environment within which the substrate resides during processing may be evacuated or contain a gas suitable to the desired process. For example, embodiments of the present invention may be used in deposition or implant processes that require certain gases be provided to the chamber. The gases may be reactive, such as precursors for deposition processes, or non-reactive, such as inert gases commonly used in conventional thermal processes.

In another embodiment, the substrate may be preheated prior to performing the annealing process so that the incremental anneal energy required is minimized, which may reduce any induced stress due to the rapid heating and cooling of the substrate and also possibly minimize the defect density in the annealed areas of the substrate. In one aspect shown in FIG. 1A, the heat exchanging device 15 contains resistive heating elements 15A and a temperature controller 15C that are adapted to heat a substrate disposed on a substrate supporting surface 16. The temperature controller 15C is in communication with the controller 21. In one aspect, it may be desirable to preheat the substrate to a temperature between about 20° C. and about 750° C. In one aspect, where the substrate is formed from a silicon containing material it may be desirable to preheat the substrate to a temperature between about 20° C. and about 500° C.

In another embodiment, it may be desirable to cool the substrate during processing to reduce any inter-diffusion due to the energy added to the substrate during the annealing process. In processes requiring incremental melting of the substrate, cooling afterward may increase regrowth velocity, which can increase the amorphization of the various regions during processing. In one configuration, the heat exchanging device 15 contains one or more fluid channels 15B and a cryogenic chiller 15D that are adapted to cool a substrate disposed on a substrate supporting surface 16. In one aspect, a conventional cryogenic chiller 15D, which is in communication with the controller 21, is adapted to deliver a cooling fluid through the one or more fluid channels 15B. In one aspect, it may be desirable to cool the substrate to a temperature between about −240° C. and about 20° C.

The controller 21 (FIG. 1A) is generally designed to facilitate the control and automation of the thermal processing techniques described herein and typically may include a central processing unit (CPU) (not shown), memory (not shown), and support circuits (or I/O) (not shown). The CPU may be one of any form of computer processors that are used in industrial settings for controlling various processes and hardware (e.g., conventional electromagnetic radiation detectors, motors, laser hardware) and monitor the processes (e.g., substrate temperature, substrate support temperature, amount of energy from the pulsed laser, detector signal). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. Preferably, the program is software readable by the controller and includes code to monitor and control the substrate position, the amount of energy delivered in each electromagnetic pulse, the timing of one or more electromagnetic pulses, the intensity and wavelength as a function of time for each pulse, the temperature of various regions of the substrate, and any combination thereof.

As noted above, the energy source 20 is generally adapted to deliver electromagnetic energy to preferentially melt certain desired regions of the substrate 10. Typical sources of electromagnetic energy include, but are not limited to, an optical radiation source, an electron beam source, an ion beam source, and/or a microwave energy source. In one embodiment of the invention, the energy source 20 is adapted to deliver optical radiation, such as a laser, to selectively heat desired regions of a substrate to the melting point. In one aspect, the substrate 10 is exposed to a pulse of energy from a laser that emits radiation at one or more appropriate wavelengths, and the emitted radiation has a desired energy density (W/cm$^2$) and/or pulse duration to enhance preferential melting of certain desired regions. For laser annealing processes performed on a silicon containing substrate, the wavelength of the radiation is typically less than about 800 nm. In either case, the anneal process generally takes place on a given region of the substrate for a relatively short time, such as on the order of about one second or less. The desired wavelength and pulse profile used in an annealing process may be determined based on optical and thermal modeling of the laser anneal process in light of the material properties of the substrate.

Figure 2A:
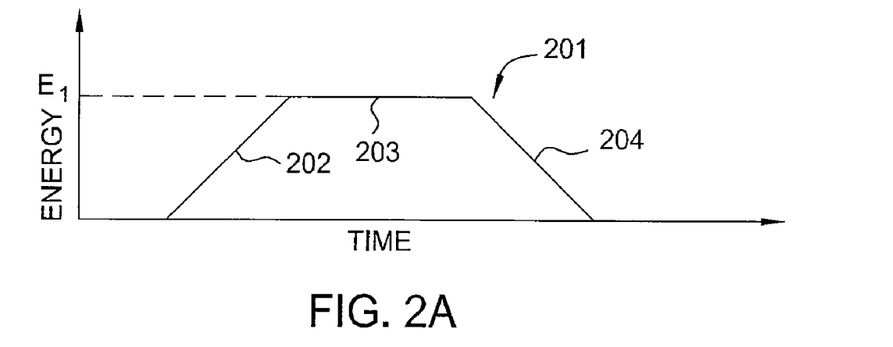
FIGS. 2A-2C illustrate various embodiments in which the various attributes of the pulse of energy delivered from an energy source to an anneal region are adjusted as a function of time to achieve improved thermal contrast and anneal process results.
Figure 2B:
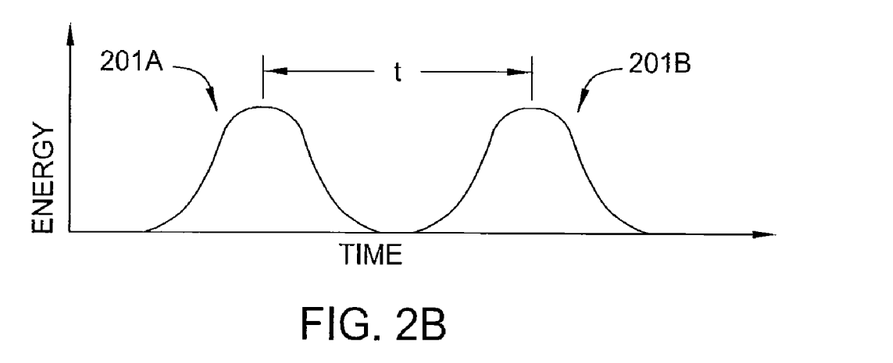
Figure 2C:
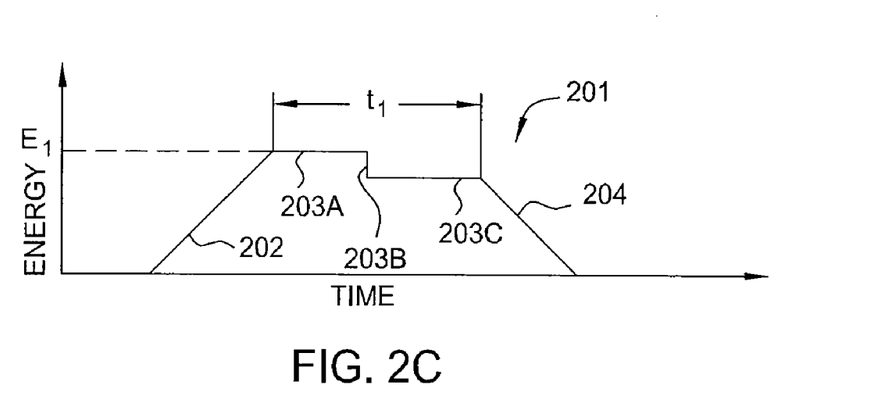

FIGS. 2A-2C illustrate various embodiments in which the various attributes of the pulse of energy delivered from an energy source 20 to an anneal region 12 (FIGS. 1A and 1B) are adjusted as a function of time to achieve improved thermal contrast and anneal process results. In one embodiment, it is desirable to vary the shape of a laser pulse as a function of time, and/or vary the wavelengths of the delivered energy to enhance the heat input into regions of the substrate intended to be melted and minimize the heat input into other regions. In one aspect, it may also be desirable to vary the energy delivered to the substrate.

FIG. 2A graphically illustrates a pulse of electromagnetic radiation (e.g., pulse 201) that is trapezoidal in shape. In this case, in two different segments (e.g., 202 and 204) of the pulse 201 the energy delivered is varied as a function of time. While FIG. 2A illustrates a pulse 201 profile, or shape, in which the energy versus time varies in a linear fashion, this is not intended to be limiting as to the scope of the invention since the time variation of the energy delivered in a pulse may, for example, have a second degree, third degree, or fourth degree shaped curve. In another aspect, the profile, or shape, of the energy delivered in a pulse as a function of time may be a second order, a third order, or exponential-shaped curve. In another embodiment, it may be advantageous to use a pulse having different shapes (e.g., rectangular and triangular modulation pulse, sinusoidal and rectangular modulation pulse, rectangular, triangular and sinusoidal modulation pulse, etc.) during processing to achieve the desired annealing results.

In one embodiment as shown in FIG. 2A, the slope of the segment 202, the shape of the pulse 201, the shape of the segment 203, the time at a power level (e.g., segment 203 at the energy level E$_1$), the slope of the segment 204, and/or the shape of the segment 204 are adjusted to control the annealing process. It should be noted that it is generally not desirable to cause the material within the annealed regions to vaporize during processing due to particle and process result variability concerns. It is therefore desirable to adjust the shape of the pulse of energy to rapidly bring the temperature of the annealed region to a target temperature without superheating the region and causing vaporization of the material. In one embodiment, as shown FIG. 2C, the shape of the pulse 201 may adjusted so that it has multiple segments (i.e., segments 202, 203A, 203B, 203C, and 204) are used to rapidly bring the anneal region to a target temperature and then hold the material at that temperature for a desired period of time (e.g., t$_1$), while preventing vaporization of material within the annealing region. The length of time, the shape of the segments and the duration of each of the pulse segments may vary as the size, melt depth, and the material contained within the annealing regions is varied.

In one embodiment, two or more pulses of electromagnetic radiation are delivered to a region of the substrate at differing times so that the temperature of regions on the substrate surface can be easily controlled. FIG. 2B graphically illustrates a plot of two pulses 201A and 201B that are delivered a varying distance in time apart, or period (t), to selectively heat certain regions on the surface of a substrate. In this configuration, by adjusting the period (t) between the subsequent pulses, the peak temperature reached by regions on the substrate surface can be easily controlled. For example, by reducing the period (t), or frequency, between pulses the heat delivered in the first pulse 201A has less time to dissipate before the second pulse 201B is delivered, which will cause the peak temperature achieved in the substrate to be higher than when the period between pulses is increased. By adjusting the period in this way, the energy and temperature can be easily controlled. In one aspect, it may desirable to assure that each pulse by itself does not contain enough energy to cause the substrate to reach the target temperature, but the combination of the pulses causes the annealed regions 12 to reach the target temperature. This process of delivering multiple pulses, such as two or more pulses, will tend to reduce the thermal shock experienced by the substrate material versus delivering a single pulse of energy. Thermal shock can lead to damage of the substrate and generate particles that will create defects in subsequent processing steps performed on the substrate.

Figure 3:
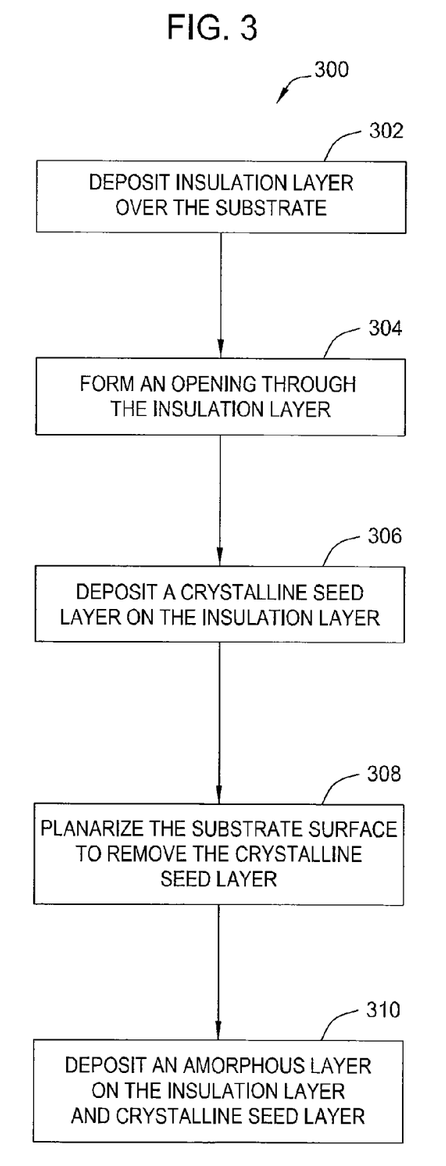
FIG. 3 is a flow chart illustrating a process according to one embodiment of the invention.
Figure 4A:
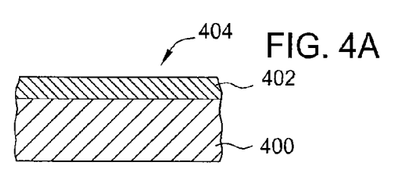
FIGS. 4A-4G illustrate schematic cross-sectional views of a substrate at various stages of the process shown in FIG. 3.

FIG. 3 is a flow chart illustrating a process 300 according to one embodiment of the invention. FIGS. 4A-4G illustrate schematic cross-sectional views of a substrate at various stages of the process 300 shown in FIG. 3. In step 302, an insulation layer 402 is formed on a front surface 404 of the substrate 400 as shown in FIG. 4A. The substrate may or may not have semiconductor devices such as a transistor disposed therein. In one embodiment, the insulation layer 402 is a dielectric layer such as oxide or nitride. In one example, the insulation layer is a silicon oxide layer formed on the front surface of a silicon containing substrate. The insulation layer may be formed using a conventional thermal oxidation process, such as a furnace annealing process, a rapid thermal oxidation process, an atmospheric pressure or low pressure CVD process, a plasma enhanced CVD process, a PVD process, an atomic layer deposition (ALD), an evaporation technique, or applied using a sprayed-on, spin-on, roll-on, screen printed, or other similar type of deposition process. In one embodiment, the insulation layer is a silicon dioxide layer that is between about 50 Å and about 3,000 Å thick. It is contemplated that the discussion of the insulation layer is not intended to be limiting as to the scope of the invention described herein. Any other dielectric materials such as silicon dioxide, silicon carbide ($SiC_x$), aluminum oxide ($AlO_x$), silicon nitride ($SiN_x$), silicon oxynitride and/or carbon-doped silicon oxides, such as SiOxCy, for example, BLACK DIAMOND® low-k dielectric, available from Applied Materials, Inc., located in Santa Clara, Calif., or the like can also be used upon the need of processing schemes.

In general the term "substrates" as used herein refers to objects that can be formed from any material that has some natural electrical conducting ability or a material that can be modified to provide the ability to conduct electricity. Typical substrate materials include, but are not limited to, semiconductors, such as silicon (Si) and germanium (Ge), as well as other compounds that exhibit semiconducting properties. Such semiconductor compounds generally include group III-V and group II-VI compounds. Representative group III-V semiconductor compounds include, but are not limited to, gallium arsenide (GaAs), gallium phosphide (GaP), and gallium nitride (GaN). Generally, the term "semiconductor substrates" includes bulk semiconductor substrates as well as substrates having deposited layers disposed thereon. To this end, the deposited layers in some semiconductor substrates processed by the methods of the present invention are formed by either homoepitaxial (e.g., silicon on silicon) or heteroepitaxial (e.g., GaAs on silicon) growth. For example, the methods of the present invention may be used with gallium arsenide and gallium nitride substrates formed by heteroepitaxial methods. Similarly, the invented methods can also be applied to form integrated devices, such as thin-film transistors (TFTs), on relatively thin crystalline silicon layers formed on insulating substrates (e.g., silicon-on-insulator [SOI] substrates). Although not shown in the drawings, it is contemplated that substrate surface may contain features such as transistor junctions, a via, contact, line, or any other interconnect facet, e.g., vertical or horizontal interconnect. A "substrate surface," as used herein, refers to any substrate surface upon which film deposition is performed. For example, a substrate surface may include an insulation layer as discussed previously.

Figure 4B:
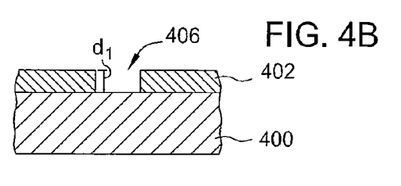

In step 304, a via or a through hole is formed in a desired location of the insulation layer 402. In one embodiment, the insulation layer 402 is selectively etched using a selective material removal process, such as a wet etch or dry etch type process until an opening 406 with a desired thickness $d_1$ is achieved, exposing a portion of an upper surface of the substrate 400, as shown in FIG. 4B. In one embodiment, the thickness $d_1$ of the opening 406 is between about 50 angstroms (Å) and about 1,000 angstroms (Å). In one embodiment, the opening 406 may be formed using a photoresist pattern as an etching mask after the photoresist pattern is formed on the insulation layer 402. It is contemplated that the opening 406 may extend into the underlying substrate 400, or have a thickness less than the thickness $d_1$ as shown without exposing a portion of the upper surface of the substrate 400, as long as the crystalline seed materials to be filled within the opening 406 is sufficient to trigger recrystallization of an amorphous layer, later to be deposited above in the following step, when receiving enough energy from a series of sequential pulses of electromagnetic radiation.

Figure 4C:
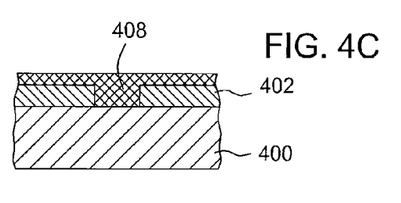
Figure 4D:
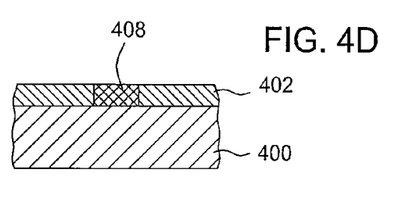

In step 306, a crystalline seed layer 408 in which a structure having a crystalline-based material is deposited on the insulation layer 402 and within the opening 406, as shown in FIG. 4C. In one embodiment, the crystalline seed layer 408 is formed using a conventional deposition process such as a chemical vapor deposition (CVD), plasma enhanced CVD, atomic layer deposition (ALD), or other similar processes. Thereafter, in step 308, the front surface 404 of the substrate 400 is planarized using a chemical mechanical polishing (CMP) process, thereby obtaining the opening 406 filled with the crystalline seed materials, as illustrated in FIG. 4D. Alternatively, the crystalline seed layer 408 may be formed by a selective epitaxial growth process, such as a vapor phase epitaxy process, a liquid phase epitaxy process, or a molecular beam epitaxy process, etc. In such a case, the crystalline seed layer 408 is generally grown from a surface of the substrate exposed through the opening 406 to achieve a substantially single-crystal, defect-free layer. In one embodiment, the crystalline seed layer 408 has a thickness substantially the same as that (i.e., $d_1$) of the insulation layer 402. In either case, the opening 406 is filled with the crystalline seed materials in a thickness substantially the same as that of the insulation layer 402, creating a crystalline seed region 408. The crystalline seed region 408 generally serve as a seed to provide a crystallization source from which epitaxial re-growth of an amorphous layer 410 that is to be deposited thereon is initiated and propagated away in all directions, such as laterally spreading across a surface of the amorphous layer, when receiving enough energy from a series of sequential pulses of electromagnetic radiation (for example, a Pulse Train Annealing process, as will be discussed below), thereby forming a desired material layer in crystalline phase on the substrate surface.

Figure 5:
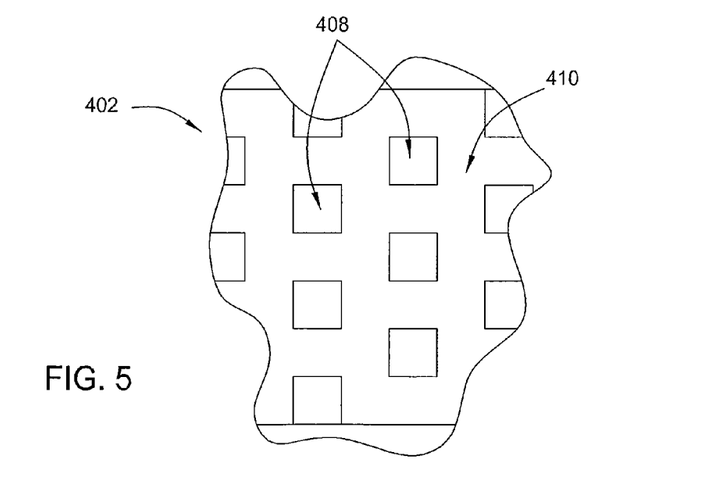
FIG. 5 is a top view of a substrate illustrating one or more crystalline seed regions are spaced-apart across an insulation layer formed below an amorphous layer.

In one embodiment, the crystalline seed region 408 is in a form of column having a desired surface area. In one embodiment, the surface area of the crystalline seed region 408 is between about 30 $nm^2$ and about 60 $nm^2$. In one example, the surface area of the crystalline seed region 408 is about 50 $nm^2$. In another embodiment, the surface area of the crystalline seed region 408 is between about 726 $mm^2$ and about 1000 $mm^2$. Although only one opening 406 is presented in the insulation layer 402 in FIG. 4C, in some embodiments it may be advantageous to have more than one openings 406 having crystalline seed materials filled therein. In one embodiment, one or more crystalline seed regions 408 are located at the edge area of the insulation layer 402. In another embodiment, one or more crystalline seed regions 408 are spaced-apart across the insulation layer 402. FIG. 5 is a top view of the substrate 400 illustrating one or more crystalline seed regions 408 being spaced-apart across the insulation layer 402 formed below an amorphous layer 410. It is contemplated that the form of the crystalline seed region 408 is not intended to be limiting to particular form or shape as described, as long as the arrangement of the crystalline seed region 408 is beneficial to overall velocity of solid phase recrystallization of the amorphous layer that is to be deposited on the crystalline seed region 408 and the insulation layer 402, when treating with pulse train annealing process as described previously. For example, the crystalline seed region 408 may be in a form of quantum dots, a desired pattern of dots, or any pre-determined shape. Alternatively, the crystalline seed materials may be presented in a form of a layer located above the insulation layer 402. In such a case, the crystalline seed layer may have adequate thickness between about 50 angstroms (Å) and about 1,000 angstroms (Å), or any desired thickness upon the need of processing schemes.

In one embodiment, the crystalline seed region 408 may contain single crystalline silicon. In another embodiment, the crystalline seed region 408 may contain single crystalline germanium. Alternatively, the crystalline seed region 408 may contain $Si_xGe_{1-x}$ alloys and other compounds that exhibit semiconducting properties. Such semiconductor compounds generally include group III-V compounds, or group II-VI compounds, either doped or undoped. Examples of suitable group IV elements or compounds include germanium, silicon germanium, and silicon carbide. Examples of suitable III-V compounds include gallium antimonide, gallium arsenide, gallium nitride, gallium phosphide, aluminum antimonide, aluminum arsenide, aluminum nitride, aluminum phosphide, indium antimonide, indium arsenide, indium nitride, indium phosphide, and their ternary or quaternary compounds. Examples of suitable II-VI compounds include zinc selenide, zinc sulfide, cadmium selenide, cadmium sulfide, and their ternary or quaternary compounds. Alternatively, in one embodiment, the crystalline seed region 408 may contain binary compounds from Groups II-VI or Groups III-V, ternary compounds from Groups II-VI or Groups III-V, quaternary compounds from Groups II-VI or Groups III-V, or mixtures or combinations thereof. Depending on application, the crystalline seed region 408 may contain metals, metalloids, or magnetic materials such as iron (Fe), cobalt (Co), nickel (Ni), and an alloy thereof, in order to serve as a magnetic media source for the amorphous layer later to be formed above the insulation layer 402 and the crystalline seed region 408, as will be discussed below.

Figure 4E:
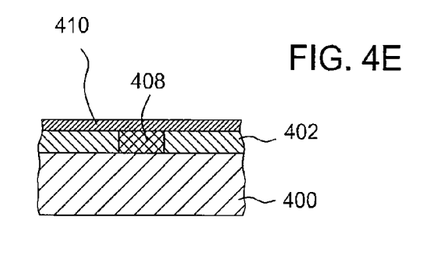
Figure 4F:
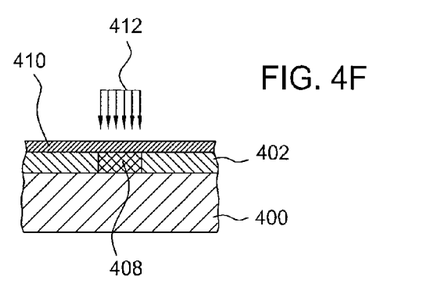

In step 310, an amorphous layer 410 is deposited on the front surface 404 of the substrate 400, covering the crystalline seed region 408 and at least a portion of the insulation layer 402. In one aspect, the amorphous layer 410 is deposited across the upper surface of the crystalline seed region 408 and the insulation layer 402, as shown in FIG. 4E. In one embodiment, the amorphous layer 410 may contain an amorphous material generally matches the material formed within the crystalline seed region 408. For example, when the crystalline seed region 408 contains the germanium material, the amorphous layer 410 may be an amorphous germanium layer. Alternatively, when the crystalline seed region 408 contains the silicon material, the amorphous layer 410 may be an amorphous silicon layer.

The amorphous layer 410 may be formed using a conventional deposition process such as a chemical vapor deposition (CVD), a plasma enhanced chemical vapor deposition (PECVD), or other similar type of deposition process, such as hot wire chemical vapor deposition (HWCVD), or atomic layer deposition (ALD). The amorphous layer 410 may have a relatively thin or any desired thickness. In one embodiment, the formed amorphous layer 410 is between about 50 angstroms (Å) and about 1,000 angstroms (Å) thick. In one example, the thickness of the formed amorphous layer 410 is about 200 angstroms (Å).

In step 312, an annealing process that uses a plurality of pulses of electromagnetic radiation 412, or Pulse Train Annealing process, is delivered to regions of the front surface 404 of the substrate 400, or to the entire front surface 404 of the substrate at once. The energy from a train of micro-annealing laser pulses promotes epitaxial re-growth of a few monolayers of the amorphous layer 410, progressively from the single crystal surface, thereby recrystallizing the amorphous layer 410. The Pulse Train Annealing process here is generally performed by the apparatus described and illustrated in conjunction with FIGS. 1A and 1B, which allows a plurality of identical pulses of electromagnetic radiation to be delivered to a substrate, each pulse accomplishing a single micro-anneal process that heats the substrate a few microns deep, or a few atomic layers of a substrate surface in a desired depth, to a submelt temperature, such as about 1300° C. for a silicon substrate, in 1 millisecond (msec) or less and then allowing the imparted energy to completely dissipate within the crystal lattice such that the temperature of the affected lattice layers returns to a lower temperature near a controlled preheat temperature. The preheat temperature refers to a temperature at which the substrate is maintained just prior to the delivery of the first pulse, and may be between about 400° C. and about 800° C. In each micro-anneal cycle, atoms not bound to the crystal lattice are moved fractions of an atomic radius. Those bound to the lattice will generally not move because they do not receive enough energy from the delivered pulse. In this manner, each micro-anneal cycle moves individual interstitial atoms into desired lattice positions. As the interstitial atoms fill lattice positions, other interstitial atoms that are not so located diffuse through the substrate until they find a desirable position within the crystal lattice. In this way, Pulse Train Annealing (hereinafter "PTA") can be used to control the atomic positions of interstitial atoms within a crystal lattice. PTA is thus a process that can be used to control the movement of atoms within the semiconductor device at atomic length scales.

In one embodiment, an annealing process that uses a plurality of pulses of electromagnetic radiation 412, or Pulse Train Annealing process, is delivered to the surface of the formed crystalline seed region 408 (i.e., the interface between the crystalline seed region 408 and the amorphous layer 410) for a desired period of time, each pulse configured to perform a micro-anneal process on at least a portion of the substrate, as discussed above and shown in FIG. 4F. Typical sources of electromagnetic energy include, but are not limited to an optical radiation source, an electron beam source, and/or a microwave energy source.

In one embodiment, the energy emissions take the form of short-duration pulses, each pulse ranging in duration from about 1 nanosecond (nsec) to about 1 second. In one embodiment, the pulses may have a duration between about 10 nsec and about 20 msec. In one embodiment, each pulse will generally deliver an energy density of about 0.2 $J/cm^2$ to about 100 $J/cm^2$ at a power level of at least 10 milliWatts (mW), such as between about 10 mW and 10 W. In one embodiment, for example, the energy density delivered by each pulse is about 0.5 $J/cm^2$. The wavelength of light used for the pulses is selected to cause an optimum movement of atoms in the crystal lattice of the substrate, promoting epitaxial re-growth of the amorphous layer 410. In some embodiments of the invention pulses of energy are delivered at wavelengths that are within the infrared spectrum. Other embodiments use pulses of light that are within the UV spectrum or combine wavelengths from different spectra. The energy or the wavelength of light used for the pulses may vary depending on the depth of the crystalline seed region 408, and the thickness or material of amorphous layer 410. In one embodiment, when the amorphous layer 410 contains amorphous silicon, for example, the light may have an energy capable of generating a temperature of above about 1,410° C. since the amorphous silicon may be melted at this temperature.

As noted above, a plurality of pulses used to promote epitaxial re-growth of the amorphous layer 410. A plurality of pulses numbering from 10 to 100,000 may be used to generate movement of atoms ranging from about a single lattice plane, or about one atomic distance, to a number of lattice planes, or a number of atomic distances. In one embodiment, at least 30 pulses, such as between about 30 and about 100,000 pulses, are used to anneal and recrystallize the amorphous layer 410. In another embodiment, at least 50 pulses, such as between about 50 and about 100,000 pulses, are used to anneal and recrystallize the amorphous layer 410. In another embodiment, at least 70 pulses, such as between about 70 and about 100,000 pulses, are used to anneal and recrystallize the amorphous layer 410. In another embodiment, at least 100 pulses, such as between about 100 and about 100,000 pulses, are used to anneal and recrystallize the amorphous layer 410. In another embodiment, between about 10,000 and about 70,000 pulses, such as about 50,000 pulses, are used to anneal and recrystallize the amorphous layer 410. As discussed above, each pulse accomplishes a complete micro-anneal cycle. Allowing the pulse energy to dissipate completely within the substrate freezes the movement prior to application of the next pulse. Adjusting the number of pulses in this way allows control of rearrangement of atoms within the crystal lattice of amorphous layer.

Intending not to be bound by theory, it is believed that each pulse that strikes the substrate surface will produce a vibration in the crystal lattice that propagates through the substrate 400. If the interval between pulses is shorter than the time required to dissipate the heat delivered by the individual pulses, heat builds up in the lattice, and the temperature of the lattice rises. However, if the interval between delivered pulses is long enough, the additive effects of each pulse will not cause temperature to rise in the substrate, and thus the thermal effects of each pulse will be localized to areas where the crystalline seed region 408 is located, or to areas just below the surface of the substrate, for example up to about 100 Angstroms or more below the surface depending on pulse duration and intensity. Therefore, the substrate is heated to a temperature below its melting point but high enough to allow rearrangement of lattice atoms and re-growth of the amorphous layer. In one embodiment, the vibration energy imparted to the crystal lattice by a pulse delivering between about 0.2 J/cm$^2$ and about 100 J/cm$^2$ of energy to the surface of a substrate may dissipate as heat and radiate away within about 1 microsecond following the end of the pulse. It is contemplated that the amount of energy required to perform the laser anneal process on a semiconductor substrate described herein can be quite large. For example, the dose of energy delivered from the energy source may be between about 1 and about 10 Joules over an 8 to 10 nanosecond (ns) pulse duration, which is equivalent to delivering an average total power of between about 100 MW to about 1,250 MW in each pulse to the anneal region. If the anneal regions have an area of between about 4 mm$^2$ and about 1000 mm$^2$ the average energy density will be between about 0.1 MW/mm$^2$ and about 313 MW/mm$^2$. Although it is preferred for each pulse to deliver the same energy, in some embodiments it may be advantageous to deliver pulses with energy that varies according to a predetermined recipe, such as, for example, ramping up or down in desired patterns.

It is contemplated that the intensity and wavelength of electromagnetic radiation may be tuned depending on the depth of crystalline seed region and the amount of movement desired. Wavelengths of energy used may range generally from the microwave, for example about 3 cm, through visible wavelengths, into the deep ultraviolet, for example about 150 nanometers (nm). Wavelengths ranging from about 300 nm to about 1100 nm, for example, may be used in laser applications, such as wavelengths less than about 800 nm. Since the effectiveness of the laser anneal process is dependent on the transmission, absorption and reflection of the energy delivered from the energy source by the material to be annealed, the wavelength ($\lambda$) or wavelengths, of the delivered energy may be tuned so that they deliver a desired amount of energy to a desired depth within the substrate. Therefore, the thinner the amorphous layer 410, the shorter the wavelength of electromagnetic radiation is required to penetrate the amorphous layer 410. In this way, it is possible to epitaxial re-growth of amorphous layer in a depth selective manner.

Figure 4G:
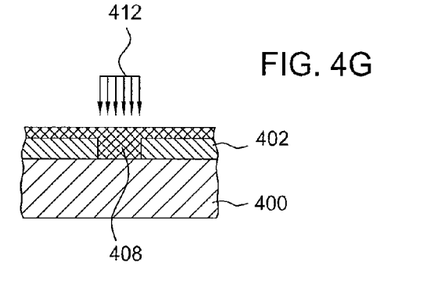

The Pulse Train Annealing process described above allows atomic level control of movement of atoms within the amorphous layer 410 by delivering a plurality of identical pulses of electromagnetic radiation, wherein each pulse executes a complete micro-anneal cycle. In step 314, each pulse of electromagnetic radiation delivered to or absorbed by a surface of the crystalline seed region 408 provides energy to atoms that are at or near the surface of the crystalline seed region 408, from which epitaxial re-growth of the amorphous layer 410 is initiated and propagated away in all directions, such as laterally across a surface of the amorphous layer 410, so that the amorphous layer 410 is progressively recrystallized and having the same grain structure and crystal orientation as the underlying crystalline seed region 408, as shown in FIG. 4G.

Although the seed region in a crystalline phase is described here, it is contemplated that the concept of the present invention is also applicable to a seed region in a different phase, such as polycrystalline. In one embodiment where the opening 406 is filled with polycrystalline seed materials, the polycrystalline seed region will provide a crystallization source from which seed polycrystalline growth is initiated and propagated away throughout the amorphous layer deposited thereabove, when receiving enough energy from a series of sequential pulses of electromagnetic radiation (for example, the PTA process as described above), thereby forming a desired material layer in polycrystalline phase on the substrate surface.

Figure 6:
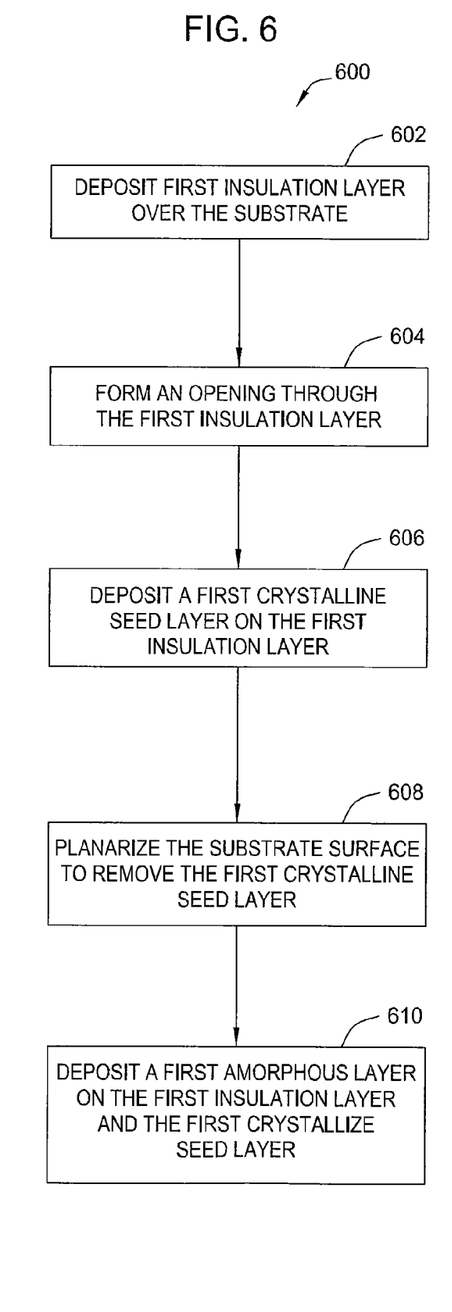
FIG. 6 is a flow chart illustrating a process according to another embodiment of the present invention.

FIG. 6 is a flow chart illustrating a process 600 according to another embodiment of the present invention. FIGS. 7A-7L illustrate schematic cross-sectional views of a substrate at various stages of the process 600 shown in FIG. 6. As the processing steps described in step 602 to step 610 are similar to the process(es) performed in conjunction with step 302 to step 310, which are discussed above, the individual processing step will not re-discussed herein.

In step 612, a second insulation layer 702 is formed over the amorphous layer 410. The second insulation layer 702 may contain a dielectric material that is similar to the insulation layer 402. The deposition process and steps performed in step 612 are generally the same as the process(es) performed in conjunction with step 302, which is described above. The second insulation layer 702 may or may not have the same thickness as the insulation layer 402, depending on the need of processing schemes.

Figure 7A:
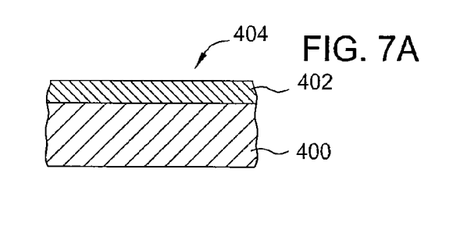
FIGS. 7A-7L illustrate schematic cross-sectional views of a substrate at various stages of the process shown in FIG. 6.
Figure 7B:
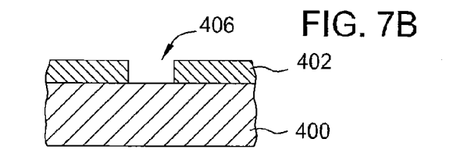
Figure 7C:
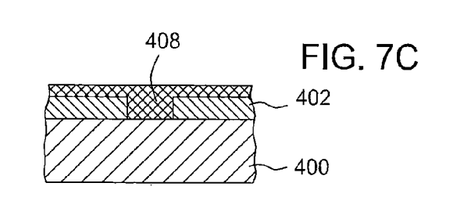
Figure 7D:
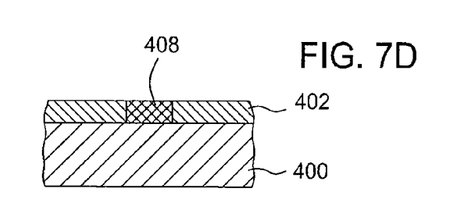
Figure 7E:
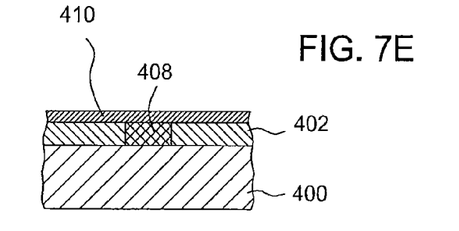
Figure 7F:
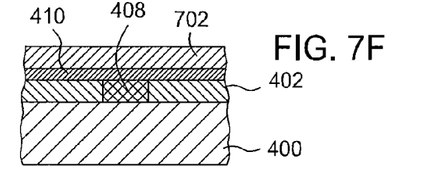
Figure 7G:
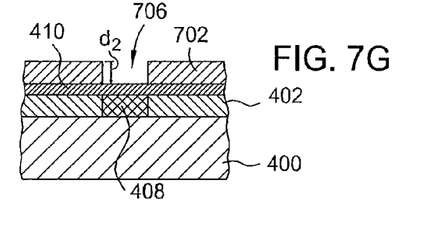

In step 614, the second insulation layer 702 is selectively etched using a selective material removal process that is generally the same as the process(es) performed in conjunction with step 304 until an opening 706 with a desired thickness $d_2$ is achieved, exposing a portion of an upper surface of the amorphous layer 410, as shown in FIG. 7G. In one embodiment, the thickness $d_2$ of the opening 706 is between about 50 angstroms (Å) and about 1,000 angstroms (Å). It is contemplated that the opening 706 may have a thickness less than the thickness $d_2$ as shown without exposing a portion of an upper surface of the amorphous layer 410.

Figure 7H:
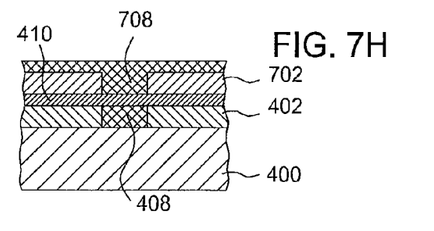
Figure 7I:
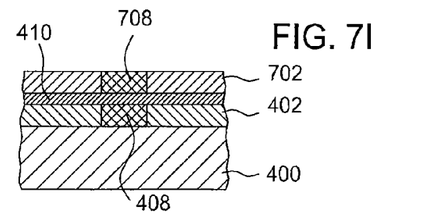

In step 616, a second crystalline seed layer 708 in which a structure having a crystalline-based material is deposited on the second insulation layer 702 and within the opening 706, as shown in FIG. 7H. The formation of the second crystalline seed layer 708 performed in step 616 is generally the same as the process(eS) performed in conjunction with step 306, which is discussed above. Thereafter, in step 618, the front surface 404 of the substrate 400 is planarized using a CMP or similar process, so that an opening 706 filled with the crystalline seed materials is obtained, as shown in FIG. 7I. Alternatively, the second crystalline seed layer 708 may be formed by a selective epitaxial growth process as discussed above in conjunction with step 306. In one embodiment, the second crystalline seed layer 708 (FIG. 7I) may have a thickness substantially the same as that (i.e., $d_2$) of the second insulation layer 702. In either way, the opening 706 is filled with the crystalline seed materials in a thickness substantially the same as that of the second insulation layer 702, creating a second crystalline seed region 708.

In one embodiment, the second crystalline seed region 708 is in a form of a column, a layer, quantum dots, or any desired pattern of dots or shape having a similar condition (e.g., surface area or thickness) as described above in conjunction with step 308. Similarly, it may be advantageous for the second crystalline seed region 708 to have more than one regions as shown in FIG. 5, so as to increase the velocity of solid phase recrystallization of the second amorphous layer that is to be deposited on the second crystalline seed region 708, when receiving enough energy from a series of sequential pulses of electromagnetic radiation (for example, the pulse train annealing process as described previously).

Upon the need of processing schemes, in one embodiment, the second crystalline seed region 708 may contain a material or a compound that is similar to that of the crystalline seed region 408. For example, when the crystalline seed region 408 contains the silicon material, the second crystalline seed region 708 may contain the germanium material, or vice versa. In one embodiment, the second crystalline seed region 708 may contain a material or a compound that is different from that of the crystalline seed region 408. In one embodiment, the second crystalline seed region 708 may contain single crystalline silicon. In another embodiment, the second crystalline seed region 708 may contain single crystalline germanium. Alternatively, the second crystalline seed region 708 may contain silicon-germanium. In yet another embodiment, the second crystalline seed region 708 may contain or consist essentially of a group IV element or compound, a III-V compound, or a II-VI compound, either doped or undoped, as the examples described previously. The second crystalline seed region 708 may contain metals, metalloids, or magnetic materials such as iron (Fe), cobalt (Co), nickel (Ni), and an alloy thereof, in order to function as a magnetic media source for the amorphous layer that is to be formed on the second insulation layer 702 and the second crystalline seed region 708.

Figure 7J:
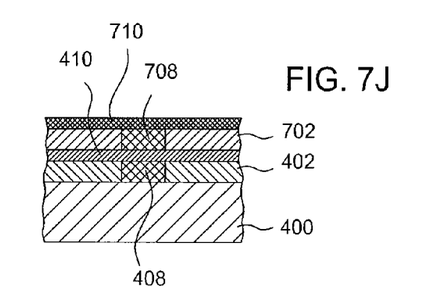
Figure 7K:
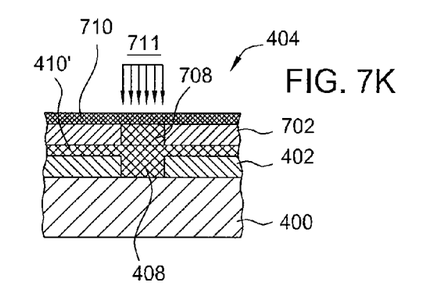
Figure 7L:
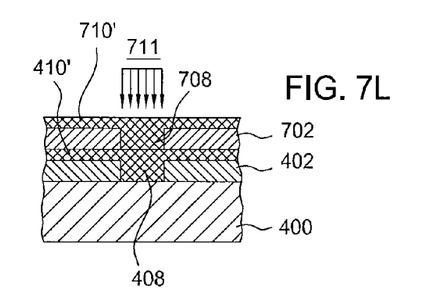

In step 620, a second amorphous layer 710 is deposited over the front surface 404 of the substrate 400, covering the second crystalline seed region 708 and at least a portion of the second insulation layer 702. In one aspect, the second amorphous layer 710 is deposited across the upper surface of the second crystalline seed region 708 and the second insulation layer 702, as shown in FIG. 7J. In one embodiment, the second amorphous layer 710 may contain an amorphous material generally matches the material formed within the second crystalline seed region 708. For example, when the second crystalline seed region 708 contains the germanium material, the second amorphous layer 710 may be an amorphous germanium layer. Alternatively, when the second crystalline seed region 708 contains the silicon material, the second amorphous layer 710 may be an amorphous silicon layer.

In the embodiment shown in FIG. 7J, the second amorphous layer 710 and the second crystalline seed region 708 are formed at a higher level of the structure, while the amorphous layer 410 and the crystalline seed region 408 are formed at a lower level of the structure. In one embodiment, the second amorphous layer 710 and the second crystalline seed region 708 are generally parallel and opposite to the amorphous layer 410 and the crystalline seed region 408. In cases where the second crystalline seed region 708 and the crystalline seed region 408 are in a form of column, dot, or any desired shape, the second crystalline seed region 708 may or may not align with the crystalline seed region 408 when viewing from top of the structure. While not shown here, it is contemplated that there may be other semiconductor devices, such as a transistor, formed below the substrate 400 and/or between the second insulation layer 702 and the amorphous layer 410, depending upon application.

The second amorphous layer 710 may be formed using a deposition process that is generally the same as the process (es) performed in conjunction with step 310. In one embodiment, the second amorphous layer 710 may have a relatively thin thickness or a desired thickness. In one embodiment, the formed second amorphous layer 710 is between about 50 angstroms (Å) and about 1,000 angstroms (Å) thick. In one example, the thickness of the second amorphous layer 710 is about 200 angstroms (Å). However, it is contemplated that a different thickness may be deposited upon the need of processing schemes.

In step 622, an annealing process that uses a plurality of pulses of electromagnetic radiation energy 711, or Pulse Train Annealing, is delivered to regions of the front surface 404 of the substrate 400, or to the entire front surface 404 of the substrate at once. The Pulse Train Annealing process described here is delivered in a manner that is generally the same as the process(es) performed in conjunction with step 312. However, since the effectiveness of the laser anneal process is dependent on the transmission, absorption and reflection of the energy delivered from the energy source by the material to be annealed, the wavelength ($\lambda$) or wavelengths, of the delivered energy may be tuned so that they deliver a desired amount of energy to a desired depth within the substrate. It should be noted that the amount of energy delivered by each photon of light also varies as a function of wavelength ($E=hc/\lambda$), and thus the shorter the wavelength the greater the energy delivered by each photon of light. In some cases, certain materials, such as silicon, has an absorption edge that varies with thickness and wavelength, which limit the wavelengths that are absorbed by the substrate material. Therefore, depending on the thickness and type of material from which the substrate is made, the wavelength(s) of the emitted radiation may be varied to achieve the desired energy transfer to the substrate to minimize damage and promote uniform heating of the exposed region of the substrate. In this way, when multiple layers of crystalline seed and amorphous layer are used, as the embodiment shown in FIG. 7J, the energy or wavelengths of the plurality of pulses of electromagnetic radiation may be adjusted, depend on the thickness and type of material, in order to deliver a desired amount of energy to a desired depth within the substrate without melting the layer(s) under the targeted layer.

In one embodiment where multiple layers are employed, for example the structure shown in FIG. 7J, a series of sequential pulses of electromagnetic radiation energy 711 is adapted to deliver energy at a wavelength less than about 1064 nm to, or absorbed by a surface of the crystalline seed region 408, providing energy to atoms that are at or near the surface of the crystalline seed region 408, from which epitaxial re-growth of the amorphous layer 410 deposited thereon is initiated and propagated away in all directions, such as laterally across a surface of the amorphous layer 410. The object of annealing is to reorder the atoms throughout the amorphous layer 410 at regular locations in the crystal lattice, using crystalline seed region 408 as a seed, so that the amorphous layer 410 is progressively recrystallized and having the same grain structure and crystal orientation as the underlying crystalline seed region 408. The converted silicon layer is labeled as reference numeral 410' illustrated in step 622 and shown in FIG. 7K. Thereafter, a series of sequential pulses of electromagnetic radiation 711 is adapted to deliver energy at wavelengths that are less than about 800 nm to, or absorbed by a surface of the second crystalline seed region 708, from which seed crystalline growth is initiated and propagated away in all directions, such as laterally across the surface of the second amorphous layer 710, thereby recrystallizing the second amorphous layer 710. The converted silicon layer is labeled as reference numeral 710' illustrated in step 624 and shown in FIG. 7L. In one example, the wavelength of the electromagnetic energy delivered from the energy source is about 532 nm to the second crystalline seed region 708. In yet another example, the wavelength of the electromagnetic energy delivered from the energy source is about 216 nm or about 193 nm to the second crystalline seed region 708. In one aspect of the invention, a Q-switched, Nd:YAG (neodymium-doped yttrium aluminum garnet) laser is adapted to deliver energy at a wavelength between about 266 nm and about 1064 nm. Although the timing, the duration, the profile of the pulse (e.g., energy versus time) and the number of pulses are similar to those performed in conjunction with step 312, which are discussed above, these parameters can be adjusted upon the need of processing schemes. For example, the electromagnetic energy to the crystalline seed region 408 is applied between about 30 pulses and about 10,000 pulses while the electromagnetic energy to the second crystalline seed region 708 is applied between about 10,000 and about 100,000 pulses, or visa versa, depending on the depth of crystalline seed region and the amount of movement desired.

It is contemplated that the present invention is not limited to two crystalline seed regions and two amorphous layers as described. Since it is possible to re-growth of amorphous layer in a depth selective manner by varying the profile of the energy pulse, any number of layers may be employed. In the case where a structure has multiple layers (e.g., two or more crystalline seed regions and amorphous layers), an amorphous layer that has previously been recrystallized may become a new crystalline seed source for an amorphous layer adjacent thereto but not yet recrystallized, thereby increasing the overall velocity of recrystallization process.

It is also contemplated that the number and sequence of steps illustrated in FIGS. 4 and 7 are not intended to limiting as to the scope of the invention described herein, since one or more steps can be added, deleted and/or reordered without deviating from the basic scope of the invention described herein. For example, in the embodiment shown in FIGS. 7J and 7K, a series of sequential pulses of energy at a shorter wavelength, for example between about 266 nm and about 532 nm, may be first delivered to a surface of the second crystalline seed region 708, and then a series of sequential pulses of energy at a longer wavelength, for example between about 800 nm and 1064 nm, then are delivered to a surface of the crystalline seed region 408. Alternatively, the first amorphous layer 410 may be treated with Pulse Train Annealing process prior to the deposition of the second insulation layer 702, so that the second insulation layer 702 and the second crystalline seed region 708 are formed on the first amorphous layer 410 that has been recrystallized. In addition, although the electromagnetic energy are illustrated to be delivered at a place where the crystalline seed region is located, in some embodiment the electromagnetic energy may be delivered in a manner substantially covering the entire front surface of the structure.

While the foregoing is directed to embodiments of the present invention, other and further embodiments of the invention may be devised without departing from the basic scope thereof, and the scope thereof is determined by the claims that follow.

The invention claimed is:

1. A method of epitaxial growth of crystalline layers over a substrate, comprising:
    depositing a first insulation layer over the substrate;
    forming a first seed region having a first material in crystalline state in the first insulation layer;
    depositing a first layer of first material in amorphous state on the first seed region and at least a portion of the first insulation layer;
    depositing a second insulation layer over the first layer of first material;
    forming a second seed region having a first material in crystalline state in the second insulation layer;
    depositing a second layer of first material in amorphous state on the second seed region and at least a portion of the second insulation layer;
    directing a plurality of pulses of first electromagnetic energy toward a surface of the first seed region upon which the first layer of first material is deposited for a period of time that is sufficient to recrystallize and convert the first layer of first material, using the first seed region as a seed, from amorphous state into crystalline state and having the same grain structure and crystal orientation as the underlying first seed region; and
    directing a second electromagnetic energy having a wavelength and number of pulses that are different from the first electromagnetic energy toward a surface of the second seed region upon which the second layer of first material is deposited for a period of time that is sufficient to recrystallize and convert the second layer of first material, using the second seed region as a seed, from amorphous state into crystalline state and having the same grain structure and crystal orientation as the underlying second seed region.

2. The method of claim 1, wherein each pulse of the first and the second electromagnetic energy has energy less than that required to melt or nearly melt a portion of the first and second layers of first material.

3. The method of claim 1, wherein the first material comprises a doped or undoped semiconductor material or compound that is selected from a group consisting of silicon, germanium, $Si_xGe_{1-x}$ alloys, group III-V or group II-VI semiconductor compounds, binary compounds from Groups II-VI or Groups III-V, ternary compounds from Groups II-VI or Groups III-V, quaternary compounds from Groups II-VI or Groups III-V, or mixtures or combinations thereof.

4. The method of claim 3, wherein the first material further comprise a magnetic media that is selected from a group consisting of Fe, Co, Ni, and an alloy thereof.

5. The method of claim 1, wherein the second layer of first material comprises a semiconductor material or compound that is different from the first layer of first material.

6. The method of claim 1, wherein the first electromagnetic energy is delivered at a wavelength between about 800 nm and about 1100 nm and the second electromagnetic energy is delivered at a wavelength between about 490 nm and about 570 nm.

7. The method of claim 1, wherein the first and the second seed regions are in a form of a layer having a thickness between about 50 Å and about 1,000 Å.

8. The method of claim 1, wherein the first and the second seed regions are in a form of a predetermined shape having a surface area between about 30 $nm^2$ and about 1000 $mm^2$ and a thickness between about 50 Å and about 1,000 Å.

* * * * *